United States Patent
Ran et al.

(10) Patent No.: US 9,892,319 B2
(45) Date of Patent: Feb. 13, 2018

(54) FINGERPRINT DETECTION APPARATUS AND METHOD

(71) Applicant: SHENZHEN GOODIX TECHNOLOGY CO., LTD., Guangdong (CN)

(72) Inventors: Rui Ran, Guangdong (CN); Mengta Yang, Guangdong (CN)

(73) Assignee: SHENZHEN GOODIX TECHNOLOGY, LTD., Guangdong (CN)

( * ) Notice: Subject to any disclaimer, the term of this patent is extended or adjusted under 35 U.S.C. 154(b) by 0 days.

(21) Appl. No.: 15/112,037

(22) PCT Filed: Oct. 11, 2014

(86) PCT No.: PCT/CN2014/088383
§ 371 (c)(1),
(2) Date: Jul. 15, 2016

(87) PCT Pub. No.: WO2016/033849
PCT Pub. Date: Mar. 10, 2016

(65) Prior Publication Data
US 2017/0177934 A1    Jun. 22, 2017

(30) Foreign Application Priority Data

Sep. 4, 2014 (CN) .......................... 2014 1 0460457

(51) Int. Cl.
*G06K 9/00* (2006.01)
(52) U.S. Cl.
CPC ..... *G06K 9/00503* (2013.01); *G06K 9/00013* (2013.01)

(58) Field of Classification Search
CPC ...... H01L 28/40; G06K 9/00; G06K 9/00067; G06K 9/40; G06K 9/00013; G06K 9/00503; G06F 3/044
(Continued)

(56) References Cited

U.S. PATENT DOCUMENTS 7,668,509 B2 * 2/2010 Greeley .................... H01Q 3/26
                                                                                        455/42
9,542,588 B2 * 1/2017 Kremin ................ G06K 9/0002
(Continued)

FOREIGN PATENT DOCUMENTS

CN         1257595 A      6/2000
CN       2010019785 A     1/2010
(Continued)

OTHER PUBLICATIONS

Yeong "Computer English Translation of Korean Patent No. KR20040108069 A (pp. 1-12), 2004".*
(Continued)

*Primary Examiner* — Daniel Mariam
(74) *Attorney, Agent, or Firm* — Heslin Rothenberg Farley & Mesiti P.C.

(57) ABSTRACT

A fingerprint detection apparatus and a fingerprint detection method employ a collection module and a processing module. The collection module is configured to collect fingerprint information and generate a fingerprint detection signal. The processing module is configured to process the fingerprint detection signal and generate fingerprint image data, and includes a frequency mixer. The frequency mixer is configured to perform quadrature mixing and low pass filtering on the fingerprint detection signal, and to convert an alternating current signal of the fingerprint detection signal into a direct current signal. Therefore, the bandwidth of the fingerprint detection signal can be decreased, noises in the
(Continued)

fingerprint detection signal can be filtered out, the signal to noise ratio can be improved, the fingerprint detection sensitivity can be enhanced, and the anti-interference capacity can be increased, so that the adaptability of the fingerprint detecting apparatus to an application environment can be improved.

20 Claims, 5 Drawing Sheets

(58) Field of Classification Search
USPC .................................................. 382/124–125
See application file for complete search history.

(56) References Cited

U.S. PATENT DOCUMENTS

| | | | |
|---|---|---|---|
| 9,659,208 B2* | 5/2017 | Benkley, III | G06K 9/0002 |
| 2015/0063825 A1* | 3/2015 | Yamase | H04B 10/5053 398/154 |

FOREIGN PATENT DOCUMENTS

| | | |
|---|---|---|
| CN | 102751998 A | 10/2012 |
| CN | 102906761 A | 1/2013 |
| CN | 103376970 A | 10/2013 |
| CN | 103745194 A | 4/2014 |
| JP | 2005091139 A | 4/2005 |

OTHER PUBLICATIONS

International Search Report issued in PCT/CN2014/088383, dated Jun. 5, 2015.

* cited by examiner

FINGERPRINT DETECTION APPARATUS AND METHOD

CROSS REFERENCE TO RELATED APPLICATIONS

This application is the National Phase filing under 35 U.S.C. § 371 of PCT International Application No. PCT/CN2014/088383 filed Oct. 11, 2014, and published as WO 2016/033849 A1 on Mar. 10, 2016, which claims priority to Chinese Application No. 201410460457.0, filed Sep. 4, 2014. The contents of each of the prior applications are hereby incorporated by reference herein in their entirety.

TECHNICAL FIELD

The present invention relates to the field of fingerprint detection technologies, and more particularly, to a fingerprint detection apparatus and a fingerprint detection method.

BACKGROUND

A fingerprint detection apparatus collects fingerprint information through a collection module and generates a fingerprint detection signal, then processes the fingerprint detection signal through a processing module to generate and output fingerprint image data, and conducts matching identification on the data outputted. A capacitive fingerprint detection apparatus has been gradually applied to a handheld apparatus (for example, a mobile phone, a tablet, etc), while the application environment is complicated and versatile due to the portability of the handheld apparatus, so that the fingerprint detection apparatus also needs to cope with various application environments.

From the aspect of measuring signals, the direct influence brought by the change of the application environment is namely noises, while a noise signal will influence the signal to noise ratio of the fingerprint detection signal, and reduce the anti-interference capacity. The inventor finds through careful studies that in a usual case, the frequency spectrums of the noise signal are distributed widely, while the frequency spectrums of the fingerprint detection signal are relatively narrow. If the bandwidth of the fingerprint detection signal can be reduced, the signal to noise ratio can be improved accordingly, so as to increase the anti-interference capacity of the fingerprint detection apparatus.

SUMMARY

The main objects of an embodiment of the present invention are to provide a fingerprint detection apparatus and a fingerprint detection method, which aim at decreasing the bandwidth of the fingerprint detection signal, improving the signal to noise ratio, and increasing the anti-interference capacity.

In order to achieve the above objects, an embodiment of the present invention provides a fingerprint detection apparatus, including a collection module and a processing module, wherein the collection module is configured to collect fingerprint information and generate a fingerprint detection signal, the processing module is configured to process the fingerprint detection signal and generate fingerprint image data. The processing module includes a frequency mixer, and the frequency mixer is configured to conduct orthogonal mixing and low pass filtering processing on the fingerprint detection signal, and convert the fingerprint detection signal into a direct current signal from an alternating current signal.

Preferably, the frequency mixer is a digital frequency mixer, the processing module further includes an analog front end, an analog-to-digital converter and a digital signal processing (DSP) unit, the analog front end, the analogue-to-digital converter (ADC), the digital frequency mixer and the digital signal processing unit are electrically connected in sequence.

Preferably, the frequency mixer is an analog frequency mixer, the processing module further includes an analog front end, an analogue-to-digital converter and a digital signal processing unit, the analog front end, the analog frequency mixer, the analogue-to-digital converter and the digital signal processing unit are electrically connected in sequence.

Preferably, the frequency mixer includes a reference signal source and two parallel frequency mixing circuits, and each of the frequency mixing circuits includes a multiplying unit and a low pass filter in series, the input end of the multiplying unit and the output end of the low pass filter are respectively served as the input end and the output end of the frequency mixer. The reference signal source respectively inputs a reference signal to the multiplying units of the two frequency mixing circuits, and the reference signal includes a sinusoidal signal and a cosine signal orthogonal to each other. Preferably, the frequency of the reference signal is identical to the frequency of the fingerprint detection signal generated by the collection module and is adjustable, so as to avoid an interfering signal of a specific frequency band.

An embodiment of the present invention provides a fingerprint detection method at the same time, including:

collecting fingerprint information, and generating a fingerprint detection signal;

performing quadrature mixing and low pass filtering on the fingerprint detection signal to convert an alternating current signal of the fingerprint detection signal into a direct current signal from; and generating and outputting fingerprint image data according to the fingerprint detection signal processed.

Preferably, the step of performing quadrature mixing is digital mixing processing, and before the step of performing quadrature mixing and low pass filtering on the fingerprint detection signal, the method further includes:

performing analog-to-digital conversion on the fingerprint detection signal to convert an analog signal of the fingerprint detection signal into a digital signal.

Preferably, the quadrature mixing processing is an analog mixing processing, and after the step of performing quadrature mixing and low pass filtering processing on the fingerprint detection signal, the method further includes performing analog-to-digital conversion on the fingerprint detection signal processed to convert an analog signal of the fingerprint detection signal into a digital signal.

Preferably, the step of performing quadrature mixing and low pass filtering processing on the fingerprint detection signal includes:

dividing the fingerprint detection signal into two fingerprint detection signals, and inputting an reference signal to the two fingerprint detection signals respectively, the reference signal comprising a sinusoidal signal and a cosine signal orthogonal to each other;

performing a frequency mixing operation on each of the fingerprint detection signals and the reference signal, and obtaining a fingerprint detection signal having alternating current signal components and direct current signal components; and filtering the alternating current signal component in the fingerprint detection signal.

Preferably, the frequency of the reference signal is identical to the frequency of the fingerprint detection signal generated and is adjustable, so as to avoid an interfering signal of a specific frequency band.

According to the fingerprint detection apparatus provided by the embodiment of the present invention, the processing module is additionally provided with a frequency mixer to perform quadrature mixing and low pass filtering processing on the fingerprint detection signal through an orthogonal demodulation technology, convert the fingerprint detection signal into a direct current signal from an alternating current signal, decrease the bandwidth of the fingerprint detection signal, and can further decrease the bandwidth of the output signal by increasing the time duration of the reference signal in the frequency mixer, filter the noise in the fingerprint detection signal, increase the signal noise ratio, enhance the fingerprint detection sensitivity, and improve the anti-interference capacity, so as to improve the adaptive capacity of the fingerprint detection apparatus to application environments. Moreover, the frequency band of the signal can also be changed by adjusting the parameter coo of the reference signal, so as to avoid the frequency band of the interfering signal having larger intensity in a targeted manner, and remarkably increase the anti-interference capacity.

The object implementation, functional features and advantages of an embodiment of the present invention will be further explained with reference to the embodiments and drawings.

DETAILED DESCRIPTION

It should be understood that the specific embodiments described herein are only for explanation of the present invention only, but are not intended to limit the present invention.

Figure 1:
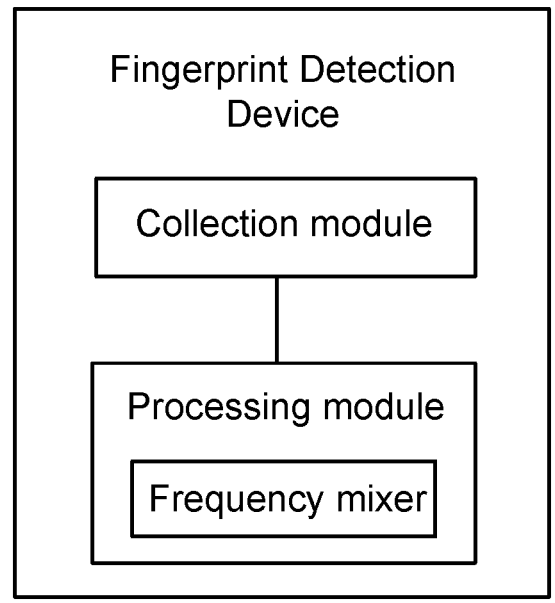
FIG. 1 is a structure block diagram of a fingerprint detection apparatus of an embodiment of the present invention.

As shown in FIG. 1, a fingerprint detection apparatus of an embodiment of the present invention includes a collection module and a processing module. The collection module is configured to collect fingerprint information and generate a fingerprint detection signal. The processing module is configured to process the fingerprint detection signal and generate fingerprint image data. The processing module includes a frequency mixer, and the frequency mixer performs quadrature mixing and low pass filtering processing on the fingerprint detection signal on the basis of an orthogonal demodulation technology, and convert an alternating current signal of the fingerprint detection signal into a direct current signal.

Figure 2:
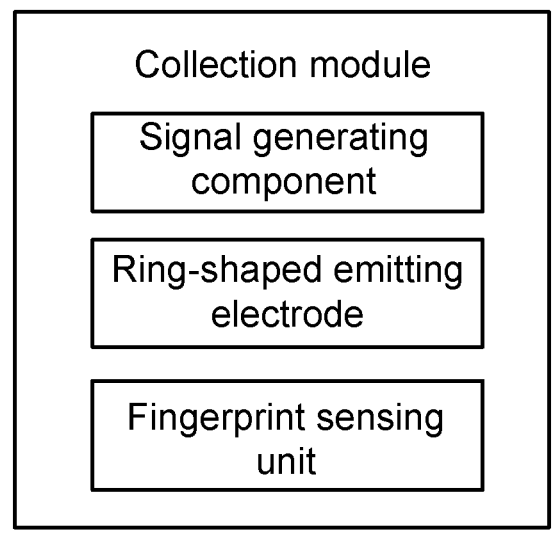
FIG. 2 is a structure block diagram of a collection module in FIG. 1.

As shown in FIG. 2, the collection module includes a signal generating component, a ring-shaped emitting electrode and a fingerprint sensing unit. The signal generating component emits a pulse signal to the ring-shaped emitting electrode. When a finger contacts with the ring-shaped emitting electrode and the fingerprint sensing unit, the fingerprint sensing unit collects the fingerprint information of the finger and generates a fingerprint detection signal according to the pulse signal. The manner for the fingerprint detection apparatus of an embodiment of the present invention to collect the fingerprint information is identical to that of the prior art, and will not be elaborated herein.

Figure 3:
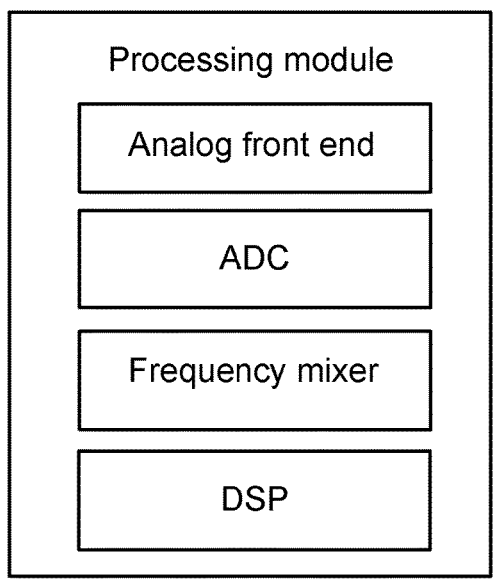
FIG. 3 is a structure block diagram of a processing module in FIG. 1.

The processing module, as shown in FIG. 3, includes an analog front end, an analog-to-digital converter, a frequency mixer and a digital signal processing unit. The specific circuit connecting relationship of each unit module will be described in the following embodiment.

Figure 4:
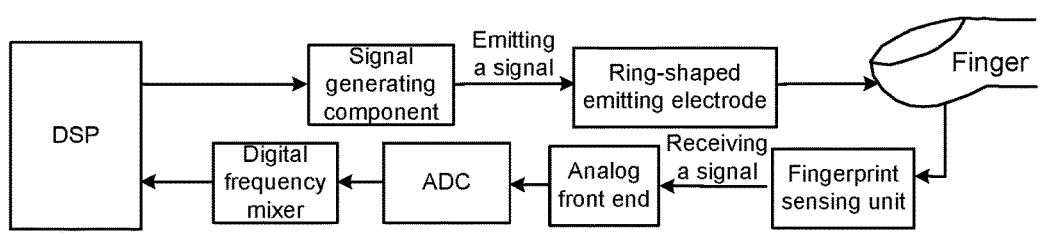
FIG. 4 is a block diagram showing circuit connection of an embodiment of a fingerprint detection apparatus of the invention.

FIG. 4 shows an embodiment of the fingerprint detection apparatus of the present invention, and the frequency mixer is a digital frequency mixer in the embodiment. The processing module includes an analog front end, an analog-to-digital converter, a digital frequency mixer and a digital signal processing unit electrically connected in sequence, wherein the analog front end is configured to receive the fingerprint detection signal generated by the fingerprint sensing unit; the analog-to-digital converter is configured to convert the fingerprint detection signal into a digital signal from an analog signal; the digital frequency mixer is configured to conduct orthogonal mixing and low pass filtering processing on the fingerprint detection signal after analog-to-digital conversion, so as to convert the fingerprint detection signal into a direct current signal from an alternating current signal; and the digital signal processing unit is configured to process the fingerprint detection signal after mixing, and generate and output fingerprint image data.

Figure 5:
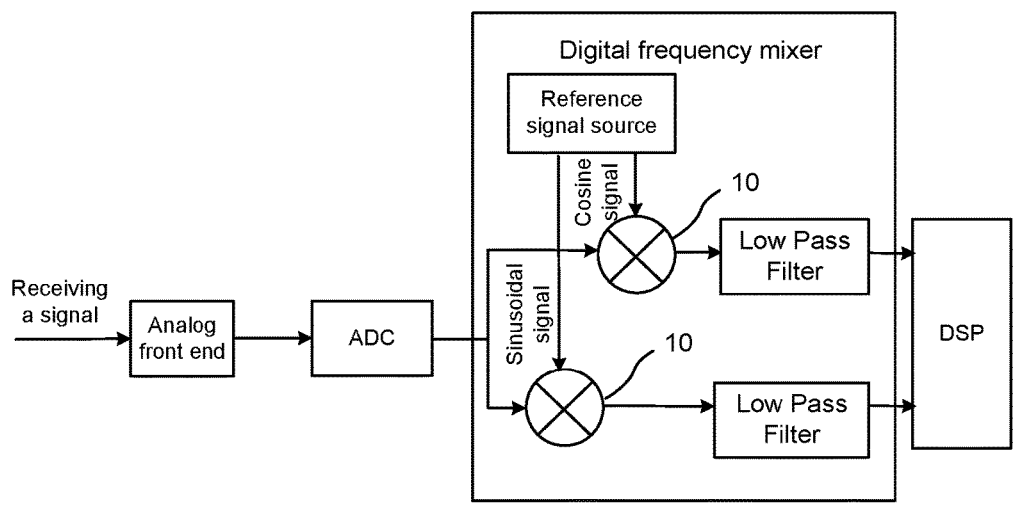
FIG. 5 is a block diagram showing circuit connection of a digital frequency mixer in FIG. 4.

The frequency mixer, as shown in FIG. 5, includes a reference signal source and two parallel frequency mixing circuits, each of the frequency mixing circuits includes a multiplying unit 10 and a low pass filter in series, the input end of the multiplying unit 10 and the output end of the low pass filter are respectively served as the input end and the output end of the digital frequency mixer, wherein the input end of the digital frequency mixer is connected with the analog-to-digital converter, the output end of the digital frequency mixer is connected with the digital signal processing unit, and the reference signal source respectively inputs a reference signal to the multiplying units 10 of the two frequency mixing circuits. The reference signal preferably refers to a sinusoidal signal and a cosine signal orthogonal to each other, i.e., the reference signal source inputs a sinusoidal signal to one frequency mixing circuit and inputs a cosine signal to another frequency mixing circuit; the multiplying unit 10 conducts a mixing operation on each of the fingerprint detection signals and the reference signal, and obtains a fingerprint detection signal having alternating current signal components and direct current signal components; and the low pass filter filters the alternating current signal component having higher frequency in the fingerprint detection signal, so that only direct current signals are remained in the fingerprint detection signal, so as to reduce the bandwidth of the fingerprint detection signal.

Figure 6:
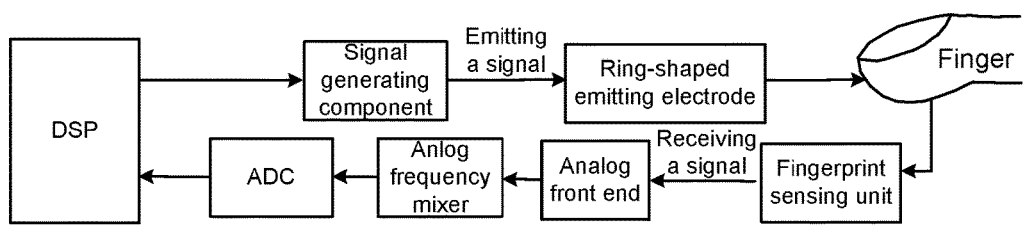
FIG. 6 is a block diagram showing circuit connection of another embodiment of the fingerprint detection apparatus of the invention.
Figure 7:
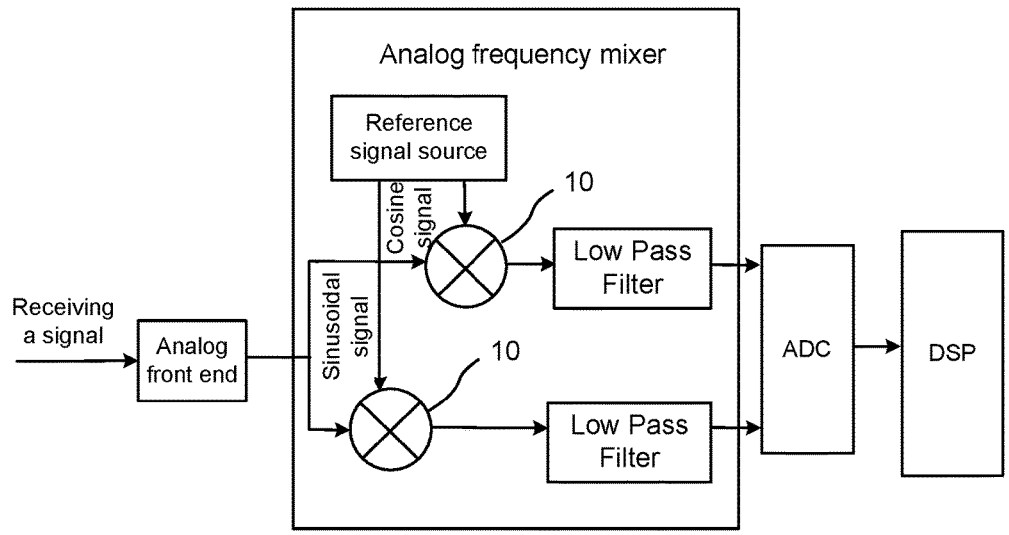
FIG. 7 is a block diagram showing circuit connection of an analog frequency mixer in FIG. 6.

FIG. 6 shows another embodiment of the fingerprint detection apparatus of the present invention, and the difference between the embodiment and last embodiment is that the frequency mixer is an analog frequency mixer. The processing module includes an analog front end, an analog frequency mixer, an analog-to-digital converter and a digital signal processing unit electrically connected in sequence. As shown in FIG. 7, the input end of the analog frequency mixer is connected with the analog front end, and the output end of the analog frequency mixer is connected with the analog-to-digital converter. The analog frequency mixer directly performs quadrature mixing and low pass filtering processing on the fingerprint detection signal served as an analog signal, and after frequency mixing processing sends the fingerprint detection signal to the analog-to-digital converter for an analog-to-digital conversion.

The generation and processing of the fingerprint detection signal in the foregoing embodiment are shown as follows.

In the fingerprint detection apparatus, the signal generating component emits a pulse signal $U_{Tx}=A_0 \sin(\omega_0 t+\varphi_0)$ to the ring-shaped emitting electrode.

When a finger touches the ring-shaped emitting electrode and the fingerprint sensing unit, the fingerprint sensing unit generates a fingerprint detection signal $U_{Rx}=A_0 A_1 \sin(\omega_0 t+\omega_0+\Delta\varphi)$ according to the fingerprint information collected and the foregoing pulse signal.

The reference signal source outputs two reference signals having a phase differences of $\pi/2$, which are respectively a sinusoidal signal $U_{R1}$ and a cosine signal $U_{R2}$, wherein $U_{R1}=K_1 \sin(\omega_0 t)$, $U_{R2}=K_2 \cos(\omega_0 t)$, the frequencies of the sinusoidal signal and the cosine signal are identical to the frequency of the fingerprint detection signal generated.

A fingerprint detection signal $U_{Rx}$ and the reference signal are subjected to mixing processing by a multiplying unit 10:

$$U_{Rx}U_{R1}=-\tfrac{1}{2}A_0A_1K_1[\cos(2\omega_0 t+\varphi_0+\Delta\varphi)-\cos(\varphi_0+\Delta\varphi)],$$

$$U_{Rx}U_{R2}=\tfrac{1}{2}A_0A_1K_2[\sin(2\omega_0 t+\varphi_0+\Delta\varphi)+\sin(\varphi_0+\Delta\varphi)].$$

The foregoing signals include alternating current signal components and direct current signal components, wherein the alternating current signal components are: $\cos(2\omega_0 t+\varphi_0+\Delta\varphi)$ and $\sin(2\omega_0 t+\varphi_0+\Delta\varphi)$, and the direct current signal components are: $\cos(\varphi_0+\Delta\varphi)$ and $\sin(\varphi_0+\Delta\varphi)$.

Then the alternating current signal components are filtered through the low pass filter, and the direct current signal components are remained only:

$$U_{Rx}U_{R1}'=-\tfrac{1}{2}A_0A_1K_1 \cos(\varphi_0+\Delta\varphi),$$

$$U_{Rx}U_{R2}'=\tfrac{1}{2}A_0A_1K_2 \sin(\varphi_0+\Delta\varphi).$$

Finally, the digital signal processing unit conducts following processing on the foregoing signals:

$$U_{ANS}=\sqrt{\left[-\tfrac{1}{2}A_0A_1K_1\cos(\varphi_0+\Delta\varphi)\right]^2+\left[\tfrac{1}{2}A_0A_1K_2\sin(\varphi_0+\Delta\varphi)\right]^2}.$$

Generally, $K_1=K_2=1$, then the result of the foregoing formula is simplified as:

$$U_{ANS}=\tfrac{1}{2}A_0A_1,$$

wherein $U_{ANS}$ is namely the output result of the digital signal processing unit.

In the above mentioned entire signal processing flow, only the signals received by the processing module having the frequency identical to that of the reference signal can be parsed, while the low pass filter determines the bandwidth of the output signal. Therefore, the gains of those signals having the same frequency and the same time duration as that of the reference signal are maximum, while the gains of other uncorrelated signals or signals having weaker correlation are smaller, and the final bandwidth of the fingerprint detection signal (i.e., the bandwidth of the output signal) is inversely proportional to the time duration of the reference signal. Most noises are uncorrelated with the reference signal; therefore, the bandwidth of the output signal can be decreased by adjusting the time T (or period) of the reference signal, so as to improve the anti-interference capacity.

Because both the frequency of the fingerprint detection signal generated by the collection module and the frequency of the reference signal can be controlled by the fingerprint detection apparatus, noises in a certain frequency band may be big in some special cases, then the frequency band of the signal can be changed through adjusting the parameter $\omega_0$ (i.e., frequency) of the fingerprint detection signal and the reference signal, so that the frequency band of the interfering signal can be avoided in a targeted manner. Wherein, the adjustment of the frequency of the fingerprint detection signal generated can be implemented by adjusting the frequency of the pulse signal.

In the foregoing process flow, each sub-module unit can be implemented flexibly, which may either be implemented in a single chip, or implemented using multiple chips.

Therefore, according to the fingerprint detection apparatus provided by an embodiment of the present invention, the processing module is additionally provided with a frequency mixer to conduct orthogonal mixing and low pass filtering processing on the fingerprint detection signal, convert the fingerprint detection signal into a direct current signal from an alternating current signal, decrease the bandwidth of the fingerprint detection signal, and can further decrease the bandwidth of the output signal by increasing the time duration of the reference signal in the frequency mixer, filter the noise in the fingerprint detection signal, increase the signal to noise ratio, enhance the fingerprint detection sensitivity, and improve the anti-interference capacity, so as to improve the adaptive capacity of the fingerprint detection apparatus to application environments. Moreover, the frequency band of the signal can also be changed by adjusting the parameters $\omega_0$ of the pulse signal and the reference signal, so as to avoid the frequency band of the interfering signal having larger intensity in a targeted manner, and remarkably increase the anti-interference capacity.

Figure 8:
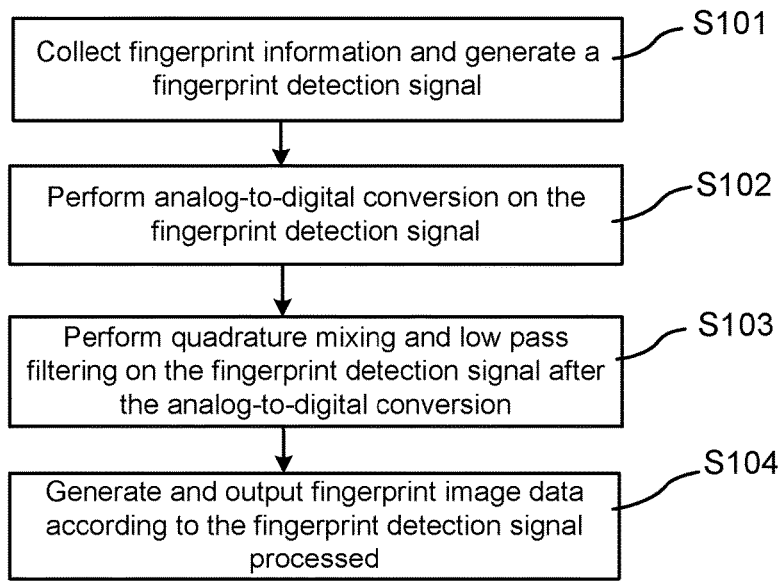
FIG. 8 is a flow chart of a first embodiment of a fingerprint detection method of the invention.

Referring to FIG. 8, an embodiment of a fingerprint detection method of the present invention is provided, wherein the fingerprint detection method includes the following steps.

At step S101, fingerprint information is collected, and a fingerprint detection signal is generated.

To be specific, the fingerprint information is collected through a collection module, and a fingerprint detection signal is generated, and it is provided that the fingerprint detection signal is $U_{Rx}=A_0A_1 \sin(\omega_0 t+\varphi_0+\Delta\varphi)$.

At step S102, analog-to-digital conversion is conducted on the fingerprint detection signal.

To be specific, the fingerprint detection signal is converted into a digital signal from an analog signal through an analog-to-digital converter.

At step S103, orthogonal mixing and low pass filtering processing is conducted on the fingerprint detection signal after the analog-to-digital conversion.

In the embodiment, mixing processing is conducted on the fingerprint detection signal (is a digital signal) after the analog-to-digital conversion by the digital frequency mixer.

To be specific, the digital frequency mixer divides the fingerprint detection signal into two, and inputs an orthogonal reference signal to the two fingerprint detection signals through a reference signal source, respectively. For example, inputs a sinusoidal signal $U_{R1}=K_1 \sin(\omega_0 t)$ to one fingerprint detection signal, and inputs a cosine signal $U_{R2}=K_2 \cos(\omega_0 t)$ to the other fingerprint detection signal; the digital frequency mixer conducts a mixing operation on each of the fingerprint detection signals and the reference signal through a multiplying unit to obtain fingerprint detection signals having alternating current signal components and direct current signal components, wherein the two fingerprint detection signals obtained are respectively as follows:

$$U_{Rx}U_{R1}=-\tfrac{1}{2}A_0A_1K_1[\cos(2\omega_0 t+\varphi_0+\Delta\varphi)-\cos(\varphi_0+\Delta\varphi)],$$

$$U_{Rx}U_{R2}=\tfrac{1}{2}A_0A_1K_2[\sin(2\omega_0 t+\varphi_0+\Delta\varphi)+\sin(\varphi_0+\Delta\varphi)].$$

The digital frequency mixer finally filters the alternating current signal components having higher frequency in the fingerprint detection signal through a low pass filter, so that only the direct current signal components are remained in the fingerprint detection signal, i.e., respectively as follows:

$$U_{Rx}U_{R1}'=-\tfrac{1}{2}A_0A_1K_1 \cos(\varphi_0+\Delta\varphi) \text{ and}$$
$$U_{Rx}U_{R2}'=\tfrac{1}{2}A_0A_1K_2 \sin(\varphi_0+\Delta\varphi).$$

Therefore, the fingerprint detection signal is converted into a direct current signal from an alternating current signal, the bandwidth of the fingerprint detection signal is reduced, and the noise signals are filtered.

At step S104, fingerprint image data is generated and outputted according to the fingerprint detection signal processed.

To be specific, the fingerprint detection signal after mixing processing is processed through a digital signal processing unit to generate and output the fingerprint image data.

Figure 9:
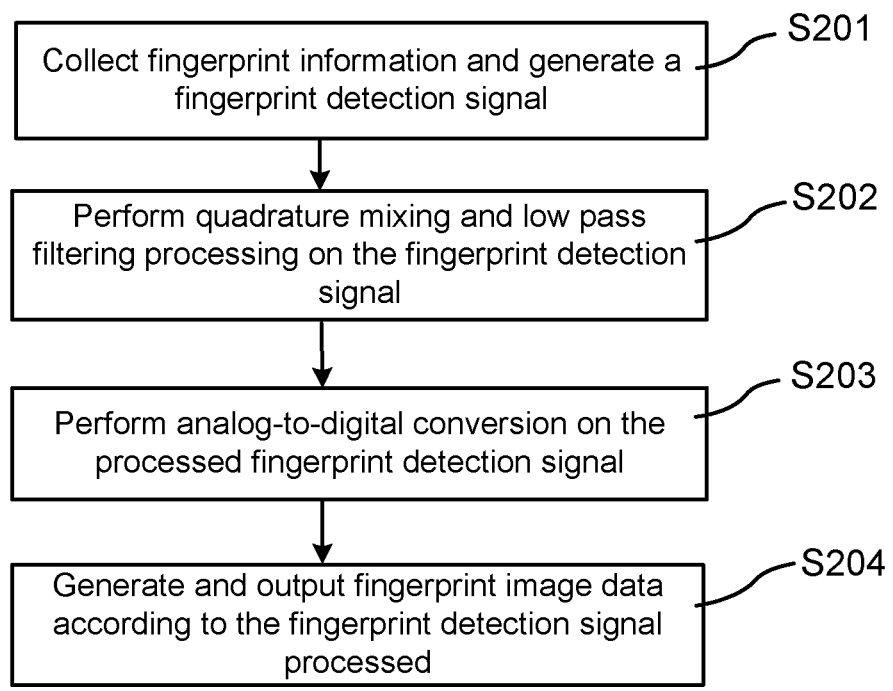
FIG. 9 is a flow chart of a second embodiment of the fingerprint detection method of the invention.

Referring to FIG. 9, a second embodiment of the fingerprint detection method of the present invention is disclosed, wherein the fingerprint detection method includes the following steps.

At step S201, fingerprint information is collected, and a fingerprint detection signal is generated.

To be specific, the fingerprint information is collected through a collection module, and a fingerprint detection signal is generated, and it is provided that the fingerprint detection signal is $U_{Rx}=A_0A_1 \sin(\omega_0 t+\varphi_0+\Delta\varphi)$.

At step S202, orthogonal mixing and low pass filtering processing is conducted on the fingerprint detection signal.

In the embodiment, mixing processing is conducted on the fingerprint detection signal (is an analog signal) after the analog-to-digital conversion by the analog frequency mixer. To be specific, the analog frequency mixer divides the fingerprint detection signal into two, and respectively inputs an orthogonal reference signal to the two fingerprint detection signals through a reference signal source, for example, inputs a sinusoidal signal $U_{R1}=K_1 \sin(\omega_0 t)$ to one fingerprint detection signal, and inputs a cosine signal $U_{R2}=K_2 \cos(\omega_0 t)$ to the other fingerprint detection signal; the analog frequency mixer conducts a mixing operation on each of the fingerprint detection signals and the reference signal through a multiplying unit to obtain fingerprint detection signals having alternating current signal components and direct current signal components, wherein the two fingerprint detection signals obtained are respectively as follows:

$$U_{Rx}U_{R1}=-\tfrac{1}{2}A_0A_1K_1[\cos(2\omega_0 t+\varphi_0+\Delta\varphi)-\cos(\varphi_0+\Delta\varphi)],$$

$$U_{Rx}U_{R2}=\tfrac{1}{2}A_0A_1K_2[\sin(2\omega_0 t+\varphi_0+\Delta\varphi)+\sin(\varphi_0+\Delta\varphi)].$$

The analog frequency mixer finally filters the alternating current signal components having higher frequency in the fingerprint detection signal through a low pass filter, so that only the direct current signal components are remained in the fingerprint detection signal, i.e., respectively as follows:

$$U_{Rx}U_{R1}'=-\tfrac{1}{2}A_0A_1K_1 \cos(\varphi_0+\Delta\varphi) \text{ and}$$
$$U_{Rx}U_{R2}'=\tfrac{1}{2}A_0A_1K_2 \sin(\varphi_0+\Delta\varphi).$$

Therefore, the fingerprint detection signal is converted into a direct current signal from an alternating current signal, the bandwidth of the fingerprint detection signal is reduced, and the noise signals therein are filtered.

At step S203, analog-to-digital conversion is conducted on the fingerprint detection signal processed.

The fingerprint detection signal after the mixing processing is an analog signal, and the fingerprint detection signal can be converted into a digital signal from an analog signal by the analog-to-digital converter.

At step S204, fingerprint image data is generated and outputted according to the fingerprint detection signal processed.

It should be illustrated that the technical features in the foregoing exemplary apparatus are all accordingly adaptive to a method embodiment of the present invention, as both of them belong to a same invention concept.

Therefore, according to the fingerprint detection method provided by an embodiment of the present invention, the fingerprint detection signal is converted into a direct current signal from an alternating current signal by conducting orthogonal mixing and low pass filtering processing on the fingerprint detection signal, so as to be capable of reducing the bandwidth of the output signal by increasing the time duration of the reference signal in the frequency mixer, filtering the noises in the fingerprint detection signal, improving the signal noise ratio, enhancing the fingerprint detection sensitivity, and improving the anti-interference capacity, so as to improve the adaptive capacity of the fingerprint detection apparatus to application environments. Moreover, the frequency band of the signal can also be changed by adjusting the parameter woof the reference signal, so as to avoid the frequency band of the interfering signal having larger intensity in a targeted manner, and remarkably increase the anti-interference capacity.

It can be understood by those having ordinary skills in the art that all or a part of steps in the method according to the foregoing embodiment can be completed by related hardware controlled by a program, wherein the program can be stored in a computer-readable storage medium, and the storage medium can be a ROM/RAM, a magnetic disk, an optical disk, etc.

It should be understood that the above is merely preferred embodiments of the present invention, but cannot limit the patent scope of the present invention. Any equivalent structure or equivalent flow transformation figured out using the description and drawing contents of the present invention, or the description and drawing contents of the present invention directly or indirectly applied in other related technical fields shall all be similarly included in the patent protection scope of the present invention.

INDUSTRIAL APPLICABILITY

According to the fingerprint detection apparatus provided by certain embodiments of the present invention, the processing module is additionally provided with a frequency mixer to conduct orthogonal mixing and low pass filtering processing on the fingerprint detection signal on the basis of an orthogonal demodulation technology, convert the fingerprint detection signal into a direct current signal from an alternating current signal, decrease the bandwidth of the fingerprint detection signal, and can further decrease the bandwidth of the output signal by increasing the time duration of the reference signal in the frequency mixer, filter the noise in the fingerprint detection signal, increase the signal noise ratio, enhance the fingerprint detection sensitivity, and improve the anti-interference capacity, so as to improve the adaptive capacity of the fingerprint detection apparatus to application environments. Moreover, the frequency band of the signal can also be changed by adjusting the parameter woof the reference signal, so as to avoid the frequency band of the interfering signal having larger intensity in a targeted manner, and remarkably increase the anti-interference capacity.

What is claimed is:

1. A fingerprint detection apparatus for processing a fingerprint detection signal to generate fingerprint image data, comprising:
   a processing module comprising a frequency mixer and a digital signal processing unit;
   wherein the frequency mixer is operable to perform quadrature mixing and low pass filtering on the fingerprint detection signal to convert an alternating current signal of the fingerprint detection signal into a direct current signal; and
   wherein the digital signal processing unit is operable to generate fingerprint image data according to the fingerprint detection signal processed by the frequency mixer.

2. The fingerprint detection apparatus according to claim 1, wherein the frequency mixer comprises a digital frequency mixer, and
   wherein the processing module further comprises an analog front end, and an analog-to-digital converter, and the analog front end, the analog-to-digital converter, the digital frequency mixer and the digital signal processing unit are electrically connected in sequence.

3. The fingerprint detection apparatus according to claim 1, wherein the frequency mixer comprises an analog frequency mixer, and
   wherein the processing module further comprises an analog front end, and an analog-to-digital converter, and the analog front end, the analog frequency mixer, the analog-to-digital converter and the digital signal processing unit are electrically connected in sequence.

4. The fingerprint detection apparatus according to claim 3, wherein the frequency mixer comprises a reference signal source and two parallel frequency mixing circuits, each of the frequency mixing circuits comprises a multiplier and a low pass filter in series, an input end of the multiplier and an output end of the low pass filter are operable as an input end and an output end of the frequency mixer, respectively, the reference signal source inputs a reference signal to the multipliers of the two frequency mixing circuits, respectively, and the reference signal comprises a sinusoidal signal and a cosine signal orthogonal to each other.

5. The fingerprint detection apparatus according to claim 4, wherein a frequency of the reference signal is identical to a frequency of the fingerprint detection signal and is adjustable, so as to avoid an interfering signal of a specific frequency band.

6. The fingerprint detection apparatus according to claim 1, wherein the frequency mixer comprises a reference signal source and two parallel frequency mixing circuits, each of the frequency mixing circuits comprises a multiplier and a low pass filter in series, an input end of the multiplier and an output end of the low pass filter are operable as an input end and an output end of the frequency mixer, respectively, the reference signal source inputs a reference signal to the multipliers of the two frequency mixing circuits, respectively, and the reference signal comprises a sinusoidal signal and a cosine signal orthogonal to each other.

7. The fingerprint detection apparatus according to claim 6, wherein a frequency of the reference signal is identical to a frequency of the fingerprint detection signal and is adjustable, so as to avoid an interfering signal of a specific frequency band.

8. The fingerprint detection apparatus according to claim 2, wherein the frequency mixer comprises a reference signal source and two parallel frequency mixing circuits, each of the frequency mixing circuits comprises a multiplier and a low pass filter in series, an input end of the multiplier and an output end of the low pass filter are operable as an input end and an output end of the frequency mixer, respectively, the reference signal source inputs a reference signal to the multipliers of the two frequency mixing circuits, respectively, and the reference signal comprises a sinusoidal signal and a cosine signal orthogonal to each other.

9. The fingerprint detection apparatus according to claim 8, wherein a frequency of the reference signal is identical to a frequency of the fingerprint detection signal and is adjustable, so as to avoid an interfering signal of a specific frequency band.

10. The fingerprint detection apparatus of claim 1, further comprising a collection module configured to collect fingerprint information and generate a fingerprint detection signal.

11. The fingerprint detection apparatus of claim 10, wherein the collection module comprises a signal generating component, a ring-shaped emitting electrode and a fingerprint sensing unit;
    wherein the signal generating component is operable to emit a pulse signal to the ring-shaped emitting electrode;
    wherein the fingerprint sensing unit is operable to collect the fingerprint information of the finger and generate a fingerprint detection signal according to the pulse signal when a user's finger contacts with the ring-shaped emitting electrode and the fingerprint sensing unit.

12. A fingerprint detection method, comprising:
    collecting fingerprint information and generating a fingerprint detection signal;
    performing quadrature mixing and low pass filtering on the fingerprint detection signal to convert an alternating current signal of the fingerprint detection signal into a direct current signal; and
    generating and outputting fingerprint image data according to the processed fingerprint detection signal.

13. The fingerprint detection method according to claim 12, wherein the quadrature mixing comprises digital mixing processing, and wherein before performing quadrature mixing and low pass filtering on the fingerprint detection signal, the method further comprises:
    performing an analog-to-digital conversion on the fingerprint detection signal to convert an analog signal of the fingerprint detection signal into a digital signal.

14. The fingerprint detection method according to claim 13, wherein the step of performing the quadrature mixing and low pass filtering on the fingerprint detection signal comprises:
    dividing the fingerprint detection signal into two fingerprint detection signals, inputting a reference signal to the two fingerprint detection signals, respectively, the reference signal comprising a sinusoidal signal and a cosine signal orthogonal to each other;

performing a mixing operation on each of the two fingerprint detection signals and the reference signal, and obtaining a fingerprint detection signal having an alternating current signal component and a direct current signal component; and filtering out the alternating current signal component in the fingerprint detection signal.

15. The fingerprint detection method according to claim 14, wherein a frequency of the reference signal is identical to a frequency of the generated fingerprint detection signal and is adjustable, so as to avoid an interfering signal of a specific frequency band.

16. The fingerprint detection method according to claim 12, wherein the quadrature mixing comprises analog mixing processing, and wherein after performing the quadrature mixing and low pass filtering on the fingerprint detection signal, the method further comprises:

performing an analog-to-digital conversion on the processed fingerprint detection signal to convert an analog signal of the fingerprint detection signal into a digital signal.

17. The fingerprint detection method according to claim 16, wherein the step of performing the quadrature mixing and low pass filtering on the fingerprint detection signal comprises:

dividing the fingerprint detection signal into two fingerprint detection signals, inputting a reference signal to the two fingerprint detection signals, respectively, the reference signal comprising a sinusoidal signal and a cosine signal orthogonal to each other;

performing a mixing operation on each of the two fingerprint detection signals and the reference signal, and obtaining a fingerprint detection signal having an alternating current signal component and a direct current signal component; and filtering out the alternating current signal component in the fingerprint detection signal.

18. The fingerprint detection method according to claim 17, wherein a frequency of the reference signal is identical to a frequency of the generated fingerprint detection signal and is adjustable, so as to avoid an interfering signal of a specific frequency band.

19. The fingerprint detection method according to claim 12, wherein the step of performing the quadrature mixing and low pass filtering on the fingerprint detection signal comprises:

dividing the fingerprint detection signal into two fingerprint detection signals, inputting a reference signal to the two fingerprint detection signals, respectively, the reference signal comprising a sinusoidal signal and a cosine signal orthogonal to each other;

performing a mixing operation on each of the two fingerprint detection signals and the reference signal, and obtaining a fingerprint detection signal having an alternating current signal component and a direct current signal component; and filtering out the alternating current signal component in the fingerprint detection signal.

20. The fingerprint detection method according to claim 19, wherein a frequency of the reference signal is identical to a frequency of the generated fingerprint detection signal and is adjustable, so as to avoid an interfering signal of a specific frequency band.

* * * * *